United States Patent
Harada

[11] Patent Number: 5,237,636
[45] Date of Patent: Aug. 17, 1993

[54] OPTICAL WAVELENGTH CONVERTING APPARATUS

[75] Inventor: Akinori Harada, Kanagawa, Japan

[73] Assignee: Fuji Photo Film Co., Ltd., Kanagawa, Japan

[21] Appl. No.: 897,044

[22] Filed: Jun. 11, 1992

[30] Foreign Application Priority Data

Jun. 14, 1991 [JP] Japan .................. 3-143085

[51] Int. Cl.[5] ............... G02B 6/10; H01S 3/10
[52] U.S. Cl. ................... 385/122; 385/14;
385/131; 385/132; 372/21; 372/22; 372/23;
372/46; 372/50
[58] Field of Search .............. 385/14, 130, 131, 132,
385/122; 372/21, 22, 23, 46, 49, 50, 92, 97

[56] References Cited

U.S. PATENT DOCUMENTS

| | | | |
|---|---|---|---|
| 4,862,473 | 8/1989 | Yano et al. | 372/50 |
| 4,930,132 | 5/1990 | Shimizu et al. | 372/22 |
| 4,951,293 | 8/1990 | Yamamoto et al. | 372/22 |
| 4,977,564 | 12/1990 | Ryu et al. | 372/32 |
| 4,982,112 | 1/1991 | Okazaki et al. | 307/425 |
| 5,027,361 | 6/1991 | Kozlovsky et al. | 372/22 |
| 5,111,466 | 5/1992 | Normandin et al. | 372/22 |
| 5,164,947 | 11/1992 | Lukas et al. | 372/22 |
| 5,168,503 | 12/1992 | Maeda | 372/22 |
| 5,175,784 | 12/1992 | Enomoto et al. | 385/122 |
| 5,185,752 | 2/1993 | Welch et al. | 372/22 |

FOREIGN PATENT DOCUMENTS

| | | | |
|---|---|---|---|
| 62-86881 | 4/1987 | Japan | 372/22 X |
| 33287 | 1/1991 | Japan | 372/22 X |

Primary Examiner—Brian Healy
Attorney, Agent, or Firm—Sughrue, Mion, Zinn, Macpeak & Seas

[57] ABSTRACT

An optical wavelength converting device is incorporated in a region inside of a resonator of a semiconductor laser, and a wavelength of a laser beam, which has been produced by the semiconductor laser and which serves as a fundamental wave, is converted by the optical wavelength converting device. A photodetector detects an intensity of the laser beam, which serves as the fundamental wave. A control circuit controls a drive current for the semiconductor laser such that the intensity of the laser beam, which intensity is indicated by an output of the photodetector, may converge to a value corresponding to a phase matching wavelength of the laser beam. The wavelength of the fundamental wave is thereby prevented from fluctuating, and a high wavelength conversion efficiency is obtained.

6 Claims, 2 Drawing Sheets

F I G. 2
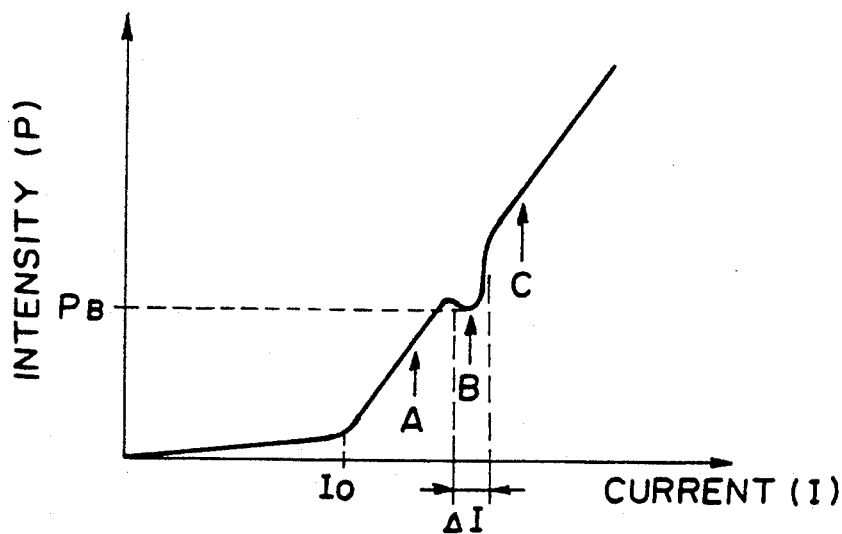
F I G. 3
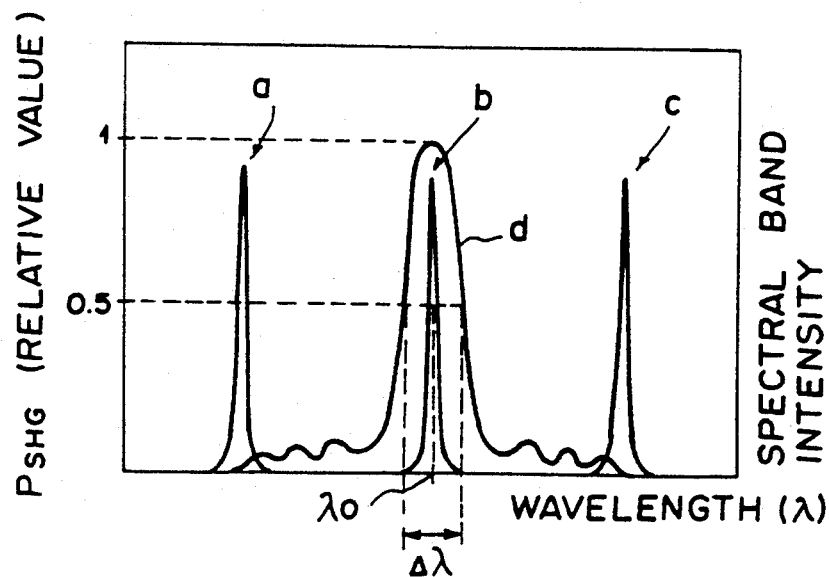

OPTICAL WAVELENGTH CONVERTING APPARATUS

BACKGROUND OF THE INVENTION

1. Field of the Invention

This invention relates to an optical wavelength converting apparatus for converting a fundamental wave into its second harmonic, or the like. This invention particularly relates to an optical wavelength converting apparatus, wherein a semiconductor laser and an optical wavelength converting device are combined with each other.

2. Description of the Prior Art

Various attempts have heretofore been made to convert the fundamental wave of a laser beam into its second harmonic, or the like, e.g. to shorten the wavelength of a laser beam, by using a nonlinear optical material. As optical wavelength converting devices for carrying out such wavelength conversion, there have heretofore been known a bulk crystal type of optical wavelength converting device, an optical waveguide type of optical wavelength converting device, and the like. These types of optical wavelength converting devices are often combined with semiconductor lasers.

In order to obtain a high efficiency, with which the wavelength conversion is effected, when a semiconductor laser and an optical wavelength converting device are combined with each other, it has been proposed to incorporate the optical wavelength converting device in the region inside of a resonator of the semiconductor laser. Such optical wavelength converting apparatuses are disclosed in, for example, Japanese Unexamined Patent Publication Nos. 62(1987)-86881 and 3(1991)-3287. With the disclosed optical wavelength converting apparatuses, a rear end face of the semiconductor laser and a front end face of the optical wavelength converting device are utilized as mirror surfaces of the resonator of the semiconductor laser. In this manner, the intensity of a fundamental wave, which passes through the optical wavelength converting device, is increased, and a high wavelength conversion efficiency can be obtained.

However, the wavelength of the fundamental wave, which is produced by the oscillation of the semiconductor laser, fluctuates in accordance with the level of a drive current fed to the semiconductor laser and the temperature of the semiconductor laser. Therefore, in the aforesaid optical wavelength converting apparatuses, the wavelength of the fundamental wave, which is produced by the oscillation of the semiconductor laser, fluctuates easily. If the wavelength of the fundamental wave fluctuates and goes beyond a range of wavelengths, at which the phase matching between the fundamental wave and its second harmonic, or the like, can be effected, the wavelength conversion efficiency inevitably becomes low.

SUMMARY OF THE INVENTION

The primary object of the present invention is to provide an optical wavelength converting apparatus, wherein a semiconductor laser and an optical wavelength converting device are combined with each other, the wavelength of a fundamental wave is prevented from fluctuating, and a high wavelength conversion efficiency is thereby obtained.

The present invention provides an optical wavelength converting apparatus, wherein an optical wavelength converting device is incorporated in a region inside of a resonator of a semiconductor laser, and a wavelength of a laser beam, which has been produced by the semiconductor laser and which serves as a fundamental wave, is converted by the optical wavelength converting device, the optical wavelength converting apparatus comprising:

i) a photodetector for detecting an intensity of said laser beam, which serves as said fundamental wave, and ii) a control circuit for controlling a drive current for said semiconductor laser such that the intensity of said laser beam, which intensity is indicated by an output of said photodetector, may converge to a value corresponding to a phase matching wavelength of said laser beam.

When the drive current for the semiconductor laser is increased in a region above a certain threshold value, the intensity of the laser beam, which is produced by the semiconductor laser, becomes higher. At the same time, the wavelength of the laser beam, which is produced by the semiconductor laser, shifts to a longer wavelength side. Specifically, the intensity of the laser beam, which has been produced by the semiconductor laser and which serves as the fundamental wave, and the wavelength thereof correspond to each other. Therefore, with the optical wavelength converting apparatus in accordance with the present invention, the drive current for the semiconductor laser is controlled such that the intensity of the fundamental wave may become equal to a predetermined value. In this manner, the wavelength of the fundamental wave can be kept at a wavelength, at which the phase matching between the fundamental wave and its wavelength-converted wave can be effected.

Accordingly, with the optical wavelength converting apparatus in accordance with the present invention, good phase matching can be effected between the fundamental wave and the wavelength-converted wave. As a result, a high wavelength conversion efficiency can be obtained.

BRIEF DESCRIPTION OF THE DRAWINGS

FIG. 2 is a graph showing the relationship between the value of a drive current for a semiconductor laser and the intensity of a fundamental wave in the embodiment of FIG. 1, and FIG. 3 is a graph showing how the wavelength of the fundamental wave changes and how the wavelength of the fundamental wave and the intensity of its second harmonic are related to each other.

DESCRIPTION OF THE PREFERRED EMBODIMENTS

Figure 1:
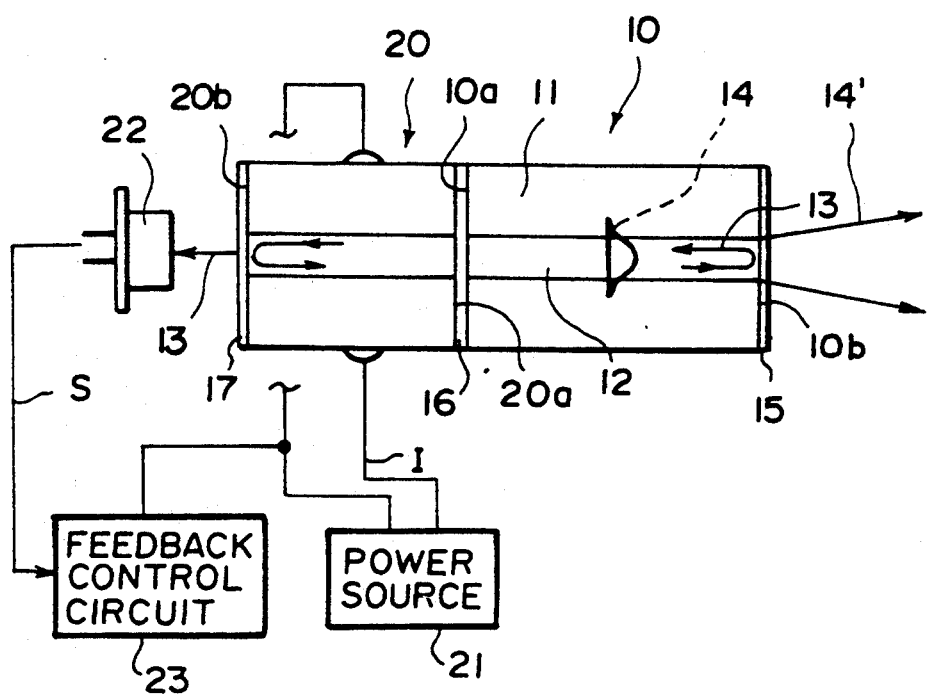
FIG. 1 is a schematic side view showing an embodiment of the optical wavelength converting apparatus in accordance with the present invention.

The present invention will hereinbelow be described in further detail with reference to the accompanying drawings.

FIG. 1 is a schematic side view showing an embodiment of the optical wavelength converting apparatus in accordance with the present invention.

With reference to FIG. 1, this embodiment is provided with an optical wavelength converting device 10 and a semiconductor laser (a laser diode) 20. By way of example, the optical wavelength converting device 10 is of the optical waveguide type. The semiconductor laser 20 produces a laser beam 13, which serves as a fundamental wave and the wavelength of which is shortened by the optical wavelength converting device 10. The optical wavelength converting device 10 comprises a cladding means 11, which may be constituted of glass, a plastic material, or the like, and a three-dimensional optical waveguide 12, which is constituted of a nonlinear optical material and which is embedded in the cladding means 11. In this embodiment, 3,5-dimethyl-1-(4-nitrophenyl)pyrazole (hereinafter referred to as DMNP), which is described in U.S. Pat. No. 4,982,112, is employed as the nonlinear optical material. As the semiconductor laser 20, a semiconductor laser producing the laser beam 13 having a fundamental wavelength of 870 nm is employed. The semiconductor laser 20 is operated by a drive current I received from an electric power source 21. The optical wavelength converting device 10 and the semiconductor laser 20 are combined with each other such that a rear end face 10a of the optical wavelength converting device 10 and a front end face 20a of the semiconductor laser 20 may be in close contact with each other.

A coating 15 is overlaid on a front end face 10b of the optical wavelength converting device 10. The coating 15 reflects approximately 100% of the laser beam 13 serving as the fundamental wave having a wavelength of 870 nm, and transmits approximately 100% of a second harmonic 14, which has a wavelength of 435 nm and which will be described later. Also, a coating 16 is overlaid on the rear end face 10a of the optical wavelength converting device 10. The coating 16 reflects approximately 100% of the second harmonic 14 having a wavelength of 435 nm. A coating 17 is overlaid on a rear end face 20b of the semiconductor laser 20. The coating 17 reflects 95% of the laser beam 13 serving as the fundamental wave. The front end face 10b provided with the coating 15 and the rear end face 20b provided with the coating 17 serve as resonator mirror surfaces. Therefore, the laser beam 13 resonates between the front end face 10b and the rear end face 20b.

The laser beam 13, which has been produced by the semiconductor laser 20, enters the optical waveguide 12. The laser beam 13 is guided through the optical waveguide 12 by being repeatedly and totally reflected by the interface between the optical waveguide 12 and the cladding means 11. The laser beam 13, which is thus guided through the optical waveguide 12, is converted by DMNP, which constitutes the optical waveguide 12, into its second harmonic 14 whose wavelength is ½ of the wavelength of the laser beam 13, i.e., is equal to 435 nm. The second harmonic 14 propagates through the optical waveguide 12 and travels in the optical wavelength converting device 10 towards its front end face 10b. By way of example, in the case of the so-called "guided-guided type", phase matching is effected between a guided mode, in which the laser beam 13 is guided through the optical waveguide 12, and a guided mode of the second harmonic 14.

A beam 14' containing the second harmonic 14 is radiated out of the front end face 10b of the optical wavelength converting device 10. The radiated beam 14' is passed through a filter (not shown), and only the second harmonic 14 is thereby taken up and utilized. In this embodiment, the optical wavelength converting device 10 is incorporated in the region inside of the resonator of the semiconductor laser 20. Therefore, the power of the laser beam 13 guided through the optical wavelength converting device 10 can be increased. This feature is advantageous in obtaining a high wavelength conversion efficiency.

How good phase matching is effected between the laser beam 13 and the second harmonic 14 will be described hereinbelow. A photodetector 22 is located facing the rear end face 20b of the semiconductor laser 20. By way of example, the photodetector 22 is constituted of a photodiode. The photodetector 22 detects the intensity P of the laser beam 13, which has passed through the coating 17. An output S of the photodetector 22 is fed into a feedback control circuit 23.

The drive current I, which is fed into the semiconductor laser 20, and the intensity P of the laser beam 13, which is detected by the photodetector 22, are related to each other approximately as shown in FIG. 2. Basically, in the region above a threshold value Io, at which the laser oscillation begins, the intensity P becomes higher as the level of the drive current I increases. However, in the region in the vicinity of a point, which is indicated by the arrow B, phase matching is effected between the laser beam 13 and the second harmonic 14 and, therefore, the intensity P of the laser beam 13 decreases locally. The reason why such a decrease in the intensity P occurs will be described hereinbelow.

As illustrated in FIG. 3, when the intensity P of the laser beam 13 becomes higher as the level of the drive current I increases, the wavelength λ of the laser beam 13 slightly shifts to the longer wavelength side. In FIG. 3, curves a, b, and c respectively indicate oscillation spectra appearing when levels of the drive current I, which are indicated by the arrows A, B, and C in FIG. 2, are fed into the semiconductor laser 20. Also, in FIG. 3, curve d indicates the relationship between the wavelength λ of the laser beam 13 and the intensity PSHG of the second harmonic 14. As illustrated in FIG. 3, at a wavelength λ=λo, phase matching is effected in a most appropriate way, and the intensity PSHG takes the maximum value. In general, a range Δλ of the wavelengths of the fundamental wave, in which an intensity PSHG higher than ½ of the maximum value is obtained, is taken as the phase matching wavelength range. When the wavelength of the laser beam 13 approximately falls within the phase matching wavelength range Δλ, good phase matching is effected between the laser beam 13 and the second harmonic 14, and wavelength conversion is achieved efficiently. Therefore, as illustrated in FIG. 2, the intensity P of the laser beam 13 decreases locally.

The feedback control circuit 23 receives the output S from the photodetector 22 and controls the level of the drive current I in accordance with the value of the output S such that the level of the drive current I may fall within a range ΔI shown in FIG. 2. The range ΔI is set to be equal to or narrower than a range corresponding to the phase matching wavelength range Δλ. As the level of the drive current I is controlled in this manner, the wavelength λ of the laser beam 13 can be kept at a wavelength falling within the phase matching wavelength range Δλ or falling within a range narrower than the phase matching wavelength range Δλ, and the laser beam 13 can be converted with a high wavelength conversion efficiency into its second harmonic 14.

By way of example, in order to control the level of the drive current I such that it may fall within the range ΔI, the feedback control circuit 23 carries out the control operation described below. Specifically, when the semiconductor laser 20 begins operating, the feedback control circuit 23 sweeps the drive current I and investigates the change characteristics of the intensity P obtained at that time. In this manner, the feedback control circuit 23 finds the point indicated by the arrow B in FIG. 2, i.e., the point at which the intensity P decreases most largely. Thereafter, the feedback control circuit 23 sets the level of the drive current I at the value of the thus found point and stores information about an intensity PB obtained at that time. Also, when the intensity P indicated by the output S of the photodetector 22 becomes higher than the value PB, the feedback control circuit 23 increases the level of the drive current I by a predetermined slight amount. If the intensity P decreases as a result of this control operation, the feedback control circuit 23 continues this control operation. If the intensity P increases as a result of this control operation, the feedback control circuit 23 lowers the level of the drive current I. In this manner, the wavelength λ of the laser beam 13 can be stabilized at a wavelength close to λo shown in FIG. 3.

In the embodiment described above, the guided-guided type of the optical wavelength converting device is employed. However, the optical wavelength converting apparatus in accordance with the present invention is also applicable when quasi-phase matching is effected with an inverted domain or when a Cherenkov radiation type of optical wavelength converting device is utilized.

Also, the optical wavelength converting apparatus in accordance with the present invention is not limited to DMNP but is applicable when an optical wavelength converting device constituted of any of other nonlinear optical materials is utilized.

Additionally, in the embodiment described above, the three-dimensional optical waveguide type of the optical wavelength converting device is utilized. However, the optical wavelength converting apparatus in accordance with the present invention is also applicable when a fiber type of optical wavelength converting device or a bulk crystal type of optical wavelength converting device is utilized.

What is claimed is:

1. An optical wavelength converting apparatus, wherein an optical wavelength converting device is incorporated in a region inside of a resonator of a semiconductor laser, and a wavelength of a laser beam, which has been produced by the semiconductor laser and which serves as a fundamental wave, is converted by the optical wavelength converting device, the optical wavelength converting apparatus comprising:
  i) a photodetector for detecting an intensity of said laser beam, which serves as said fundamental wave, and
  ii) a control circuit for controlling a drive current for said semiconductor laser such that the intensity of said laser beam, which intensity is indicated by an output of said photodetector, may converge to a value corresponding to a phase matching wavelength of said laser beam.

2. An apparatus as defined in claim 1 wherein said optical wavelength converting device is of an optical waveguide type.

3. An apparatus as defined in claim 2 wherein said optical wavelength converting device comprises a cladding means and an optical waveguide, which is embedded in said cladding means and which is constituted of a nonlinear optical material.

4. An apparatus as defined in claim 3 wherein said nonlinear optical material is 3,5-dimethyl-1-(4-nitrophenyl)pyrazole.

5. An apparatus as defined in claim 1 wherein said semiconductor laser and said optical wavelength converting device are located such that they may be in close contact with each other.

6. An apparatus as defined in claim 1 wherein said laser beam, which serves as said fundamental wave, is converted into its second harmonic.

* * * * *